US011139792B2

(12) United States Patent
Masse et al.

(10) Patent No.: US 11,139,792 B2
(45) Date of Patent: Oct. 5, 2021

(54) METHOD OF TUNING A RADIO FREQUENCY (RF) MODULE INCLUDING A NON-VOLATILE TUNABLE RF FILTER

(71) Applicant: Newport Fab, LLC, Newport Beach, CA (US)

(72) Inventors: Chris Masse, Irvine, CA (US); David J. Howard, Irvine, CA (US); Nabil El-Hinnawy, Irvine, CA (US); Gregory P. Slovin, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/775,625

(22) Filed: Jan. 29, 2020

(65) Prior Publication Data

US 2020/0169239 A1 May 28, 2020

Related U.S. Application Data

(60) Division of application No. 16/420,043, filed on May 22, 2019, which is a continuation-in-part of application No. 16/103,490, filed on Aug. 14, 2018, now Pat. No. 10,476,001, and a continuation-in-part of application No. 16/103,587, filed on Aug. 14,
(Continued)

(51) Int. Cl.
*H03H 7/01* (2006.01)
*H04B 17/21* (2015.01)
*H04B 1/16* (2006.01)
*H03H 7/12* (2006.01)

(52) U.S. Cl.
CPC ............ *H03H 7/0161* (2013.01); *H03H 7/12* (2013.01); *H04B 1/1638* (2013.01); *H04B 17/21* (2015.01)

(58) Field of Classification Search
None
See application file for complete search history.

(56) References Cited

U.S. PATENT DOCUMENTS

| 2,105,518 A | 1/1938 | Beers |
| 2,140,770 A | 12/1938 | Schofield |

(Continued)

OTHER PUBLICATIONS

"Widely Tunable Variable Capacitor With Switching and Latching Mechanisms" by Baek et al. (Year: 2015).*
(Continued)

*Primary Examiner* — Evren Seven
(74) *Attorney, Agent, or Firm* — Farjami & Farjami LLP

(57) ABSTRACT

In tuning a radio frequency (RF) module including a non-volatile tunable RF filter, a desired frequency and an undesired frequency being provided by an amplifier of the RF module are detected. The non-volatile tunable RF filter is coupled to an output of the amplifier of the RF module. A factory setting of an adjustable capacitor in the non-volatile tunable RF filter is changed by factory-setting a state of a non-volatile RF switch, such that the non-volatile tunable RF filter substantially rejects the undesired frequency and substantially passes the desired frequency. The adjustable capacitor includes the non-volatile RF switch, and the factory setting of the adjustable capacitor corresponds to a factory-set state of the non-volatile RF switch. An end-user is prevented access to the non-volatile RF switch, so as prevent the end-user from modifying the factory-set state of the non-volatile RF switch.

19 Claims, 9 Drawing Sheets

Related U.S. Application Data 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, and a continuation-in-part of application No. 16/161,960, filed on Oct. 16, 2018, and a continuation-in-part of application No. 16/418,130, filed on May 21, 2019, and a continuation-in-part of application No. 16/418,930, filed on May 21, 2019, now Pat. No. 10,536,124.

(56) References Cited

U.S. PATENT DOCUMENTS

| | | | |
|---|---|---|---|
| 2,325,174 A | 7/1943 | Cooper | |
| 2,525,566 A | 10/1950 | Terlecki | |
| 3,496,499 A | 2/1970 | Von Fange | |
| 6,448,576 B1* | 9/2002 | Davis | H01L 23/5256 257/50 |
| 6,495,998 B1 | 12/2002 | Terreault | |
| 6,535,545 B1 | 3/2003 | Ben-Bassat | |
| 6,750,734 B2 | 6/2004 | Utsunomiya | |
| 8,614,472 B1 | 12/2013 | Islam et al. | |
| 2,014,181 A1 | 7/2014 | Moon | |
| 9,257,647 B2 | 2/2016 | Borodulin | |
| 9,362,882 B1 | 6/2016 | Madan | |
| 9,368,720 B1 | 6/2016 | Moon et al. | |
| 10,164,608 B2 | 12/2018 | Belot | |
| 10,269,735 B1* | 4/2019 | Shukla | H03H 11/28 |
| 10,461,253 B1 | 10/2019 | Slovin | |
| 10,505,106 B1 | 12/2019 | Joshi | |
| 10,529,922 B1 | 1/2020 | Howard | |
| 2005/0184828 A1 | 8/2005 | Son | |
| 2005/0212090 A1* | 9/2005 | Friedrich | H01L 23/57 257/620 |
| 2007/0080389 A1 | 4/2007 | Petruzzello | |
| 2007/0099405 A1 | 5/2007 | Oliva et al. | |
| 2007/0246766 A1 | 10/2007 | Liu | |
| 2008/0042243 A1 | 2/2008 | Lee et al. | |
| 2008/0142777 A1 | 6/2008 | Park | |
| 2008/0231759 A1* | 9/2008 | Cowley | H04N 5/4401 333/176 |
| 2008/0272355 A1 | 11/2008 | Cho | |
| 2008/0291718 A1 | 11/2008 | Liu | |
| 2009/0065761 A1 | 3/2009 | Chen | |
| 2010/0246247 A1 | 9/2010 | Kim | |
| 2011/0002080 A1 | 1/2011 | Ranta | |
| 2011/0097825 A1 | 4/2011 | Cheng | |
| 2012/0037872 A1 | 2/2012 | Ikarashi | |
| 2014/0110657 A1 | 4/2014 | Redaelli | |
| 2014/0191181 A1 | 7/2014 | Moon | |
| 2014/0327497 A1 | 11/2014 | Gorbachov | |
| 2015/0022938 A1 | 1/2015 | Okada et al. | |
| 2015/0235971 A1* | 8/2015 | Smith | H03H 7/06 333/174 |
| 2016/0056373 A1 | 2/2016 | Goktepeli | |
| 2016/0300612 A1 | 10/2016 | Manipatruni et al. | |
| 2017/0133998 A1 | 5/2017 | Hino | |
| 2017/0187347 A1 | 6/2017 | Rinaldi | |
| 2017/0207764 A1 | 7/2017 | Wang | |
| 2018/0005786 A1 | 1/2018 | Navarro | |
| 2018/0019729 A1 | 1/2018 | Tsukamoto | |
| 2018/0048305 A1 | 2/2018 | Jin | |
| 2018/0138894 A1 | 5/2018 | Belot | |
| 2018/0266974 A1 | 9/2018 | Khosravani | |
| 2019/0088721 A1 | 3/2019 | Reig | |
| 2019/0165264 A1 | 5/2019 | Wu | |
| 2019/0296718 A1 | 9/2019 | Birkbeck | |

OTHER PUBLICATIONS

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

"Phase-change RF switches with Robust Switching Cycle Endurance" by Moon et al. (IEEE 2018).

"Highly Reconfigurable Aluminum Nitride MEMS Resonator Using 12 Monolithic Ally Integrated Phase Change Material Switches" by Hummel et al. (IEEE 2015).

"Switchable Aluminum Nitride MEMS Resonator Using Phase Change Materials" by Hummel et al. (TRF 2014).

* cited by examiner

METHOD OF TUNING A RADIO FREQUENCY (RF) MODULE INCLUDING A NON-VOLATILE TUNABLE RF FILTER

CLAIMS OF PRIORITY

This is a divisional of application Ser. No. 16/420,043 filed on May 22, 2019. The present application Ser. No. 16/420,043 filed on May 22, 2019 ("the parent application") is a continuation-ill-part of and claims the benefit of and priority to application Ser. No. 16/103,490 filed on Aug. 14, 2018, titled "Manufacturing RF Switch Based on Phase-Change Material,". The parent application is also a continuation-in-part of and claims the benefit of and priority to application Ser. No. 16/103,587 filed on Aug. 14, 2018, titled "Design for High Reliability RF Switch Based on Phase-Change Material,". The parent application is also a continuation-in-part of and claims the benefit of and priority to application Ser. No. 16/103,646 filed on Aug. 14, 2018, titled "PCM RF Switch Fabrication with Subtractively Formed Heater,". The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The parent application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". The parent application is further a continuation-in-part of and claims the benefit of and priority to application Ser. No. 16/418,130 filed on May 21, 2019, titled "Radio Frequency (RF) Filtering Using Phase-Change Material (PCM) RF Switches,". The parent application is also a continuation-in-part of and claims the benefit of and priority to application Ser. No. 16/418,930 filed on May 21, 2019, titled "Power Amplifier Module Using Phase-Change Material (PCM) Radio Frequency (RF) Switches and Selectable Matching Networks,". The disclosures and contents of all of the above-identified applications are hereby incorporated fully by reference into the parent application and the present divisional application.

BACKGROUND

Radio frequency (RF) amplification techniques in semiconductor dies and products may employ filters and passive components to reject or suppress undesired frequencies, such as second or higher harmonics, that are often undesirably produced during amplification of a desired frequency, e.g. a fundamental frequency. However, filters and passive components exhibit variations associated with factory fabrication, which can result in failure to reject or suppress the undesired frequencies. In these instances, the filter may be incompatible with regulatory requirements related to spurious emissions, and the semiconductor die or product may have to be discarded by the factory.

In various applications, switches can be used to reconfigure or time an individual RF filter to suppress undesired frequencies, such as harmonics. However, conventional switches are typically volatile and do not maintain their states during power off. Once the product utilizing the RF filter, e.g. a mobile phone, is in possession of an end-user, keeping power on at all times would be impractical and would also drain the battery. Conventional switches may also be unreliable and vary over time.

In various applications, fuses can be used to reconfigure a circuit. However, at radio frequencies, conventional fuses introduce significant electrical resistance, are too large, and introduce insertion losses that can prohibit RF filtering as intended. Conventional fuses are also one-time-programmable and cannot be reconfigured or re-used.

Thus, there is need for a tunable, RF filtering solution with a low insertion loss that is also non-volatile and reliable.

SUMMARY

The present disclosure is directed to a radio frequency (RF) module using a tunable RF filter with non-volatile RF switches, substantially as shown in and/or described in connection with at least one of the figures, and as set forth in the claims.

DETAILED DESCRIPTION

Figure 1:
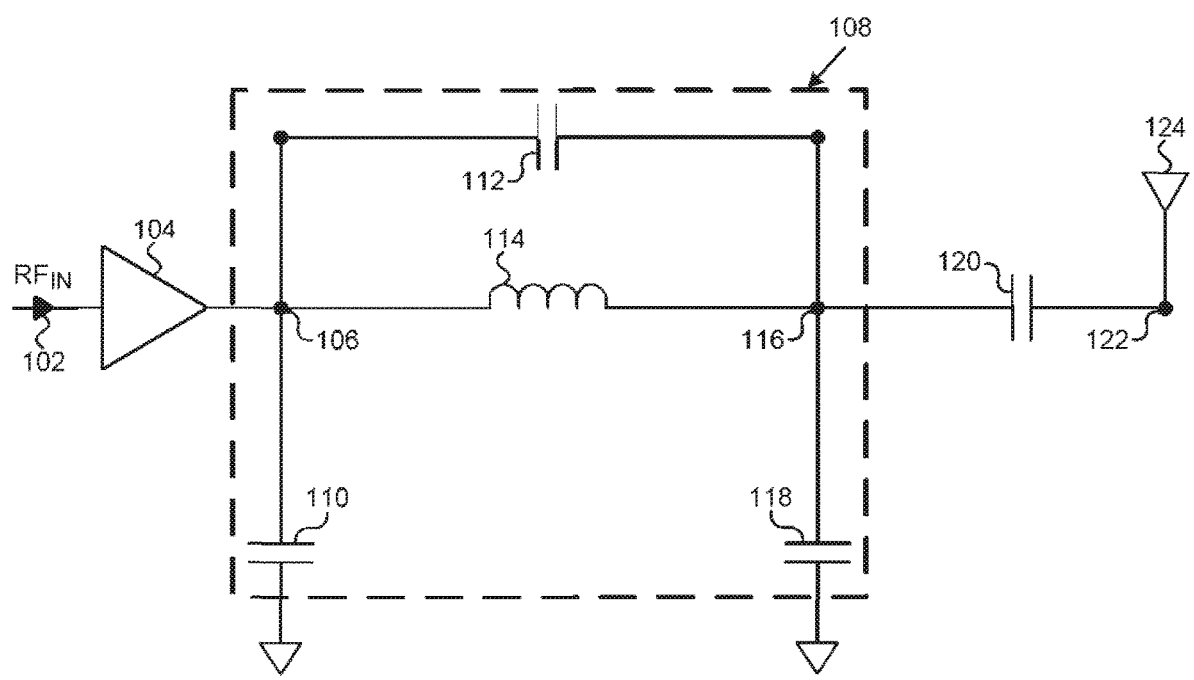
FIG. 1 illustrates a portion of a radio frequency (RF) module including an RF filter according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions. Further, in the present application the terms "connected" to/with or "coupled" to/with may be used interchangeably to have the same or similar meaning, and each term may mean direct or indirect connection.

FIG. 1 illustrates a portion of a radio frequency (RF) module including an RF filter according to one implementation of the present application. The RF module includes RF input 102, amplifier 104 having output 106, RF filter 108, and RF module output 122. RF filter 108 includes fixed capacitors 110, 112, 118, and 120, and fixed inductor 114. RF module output 122 is coupled to antenna 124.

Amplifier 104 amplifies RF signals received at RF input 102. In one implementation, amplifier 104 can be coupled to a mixer of a transmit chain (not shown in FIG. 1), or to another input source. Output 106 of amplifier 104 is coupled to RF filter 108. Amplifier 104 may be an operational amplifier and may comprise bipolar transistors and/or field effect transistors, or may be any other type of amplifier known in the art. In one implementation, amplifier 104 can be a power amplifier module for a consumer electronic device. For example, amplifier 104 and can include multiple stages of amplifiers each providing a gain to the RF signals, multiple matching networks providing impedance matching between the amplifiers, and a bias controller for biasing the amplifiers.

RF filter 108 is designed to pass desired frequencies output by amplifier 104 and to reject undesired frequencies output by amplifier 104. For example, RF filter 108 can be designed to substantially pass fundamental frequencies between five gigahertz and six gigahertz (5 GHz-6 GHz), and to substantially reject second harmonic frequencies between ten gigahertz and twelve gigahertz (10 GHz-12 GHz). In various implementations, RF filter 108 can be designed to pass and/or reject any other frequencies.

RF filter 108 includes fixed capacitors 110, 112, 118, and 120, and fixed inductor 114. Fixed capacitor 110 is coupled between output 106 of amplifier 104 and ground. Fixed capacitor 112 is coupled between output 106 of amplifier 104 and node 116. Fixed inductor 114 is also coupled between output 106 of amplifier 104 and node 116. Fixed capacitor 118 is coupled between node 116 and ground. Fixed capacitor 120 is coupled between node 116 and output 122 of the RF module. FIG. 1 illustrates one possible arrangement of RF filter 108. In various implementations, RF filter 108 can include more or fewer inductors, capacitors, and/or resistors having various values and various arrangements.

The RF module in FIG. 1 can be implemented in a consumer electronic device dial also includes antenna 124. In various implementations, the consumer electronic device can be a mobile phone, a tablet, or another personal wireless communication device. Output 122 of the RF module is coupled to antenna 124. Antenna 124 can transmit amplified and filtered RF signals output by the RF module. In one implementation, output 122 of the RF module can be coupled to an antenna array, rather than a single antenna 124. In one implementation, a receive/transmit block can lie arranged between RF module output 122 and antenna 124, in order to switch between receive and transmit modes.

Due to variations associated with factory fabrication, RF filter 108 can fail to substantially reject undesired frequencies. Continuing the above example, RF filter 108 may have been designed to substantially pass fundamental frequencies between five gigahertz and six gigahertz (5 GHz-6 GHz), and to substantially reject second harmonic frequencies between ten gigahertz and twelve gigahertz (10 GHz-12 GHz). The desired frequencies may correspond to fundamental frequencies in a wireless communication standard, such as a wireless local area network (WLAN) standard, a long-term evolution (LTE) standard, a 4G standard, or a 5G standard. The undesired frequencies may correspond to harmonic frequencies in the wireless communication standard. Due to normal process variations, any of fixed capacitors 110, 112, 118, and 120 may have a tolerance of ±20%, such that their actual capacitance values vary up to 20% from their nominal capacitance values. The frequency response of RF filter 108 correspondingly varies. As a result, at RF module output 122, RF filter 108 may fail to substantially pass all desired frequencies and/or may fail to substantially reject all undesired frequencies.

As used in the present application, "substantially passing a frequency" refers to an output RF signal having a high relative power at that frequency. Likewise, "substantially rejecting a frequency" refers to an output RF signal having a low relative power at that frequency. The relative power can be relative to an input power, relative to a normalized power, or relative to a threshold power. For example, RF Filter 108 may fail to substantially pass the desired frequencies when RF signals between five gigahertz and six gigahertz (5 GHz-6 GHz) have power below negative fifteen decibel-milliwatts (−15 dBm). As another example, RF filter 108 may fail to substantially reject undesired frequencies when RF signals between ten gigahertz and twelve gigahertz (10 GHz-12 GHz) have power above negative forty-two decibel-milliwatts (−42 dBm).

By way of an example, when RF filter 108 fails to substantially reject harmonic frequencies in a WLAN standard, antenna 124 may transmit harmonic frequencies output by the RF module having emission strengths that do not comply with United States regulatory requirements established by the Federal Communications Commission. In practice, semiconductor dies, products and consumer electronic devices using the non-compliant RF module may have to be discarded at the factory, reducing die or product yield. In some instances, most of semiconductor dies, products and consumer electronic devices using a non-compliant RF module in a given production batch may have to be discarded.

Figure 2:
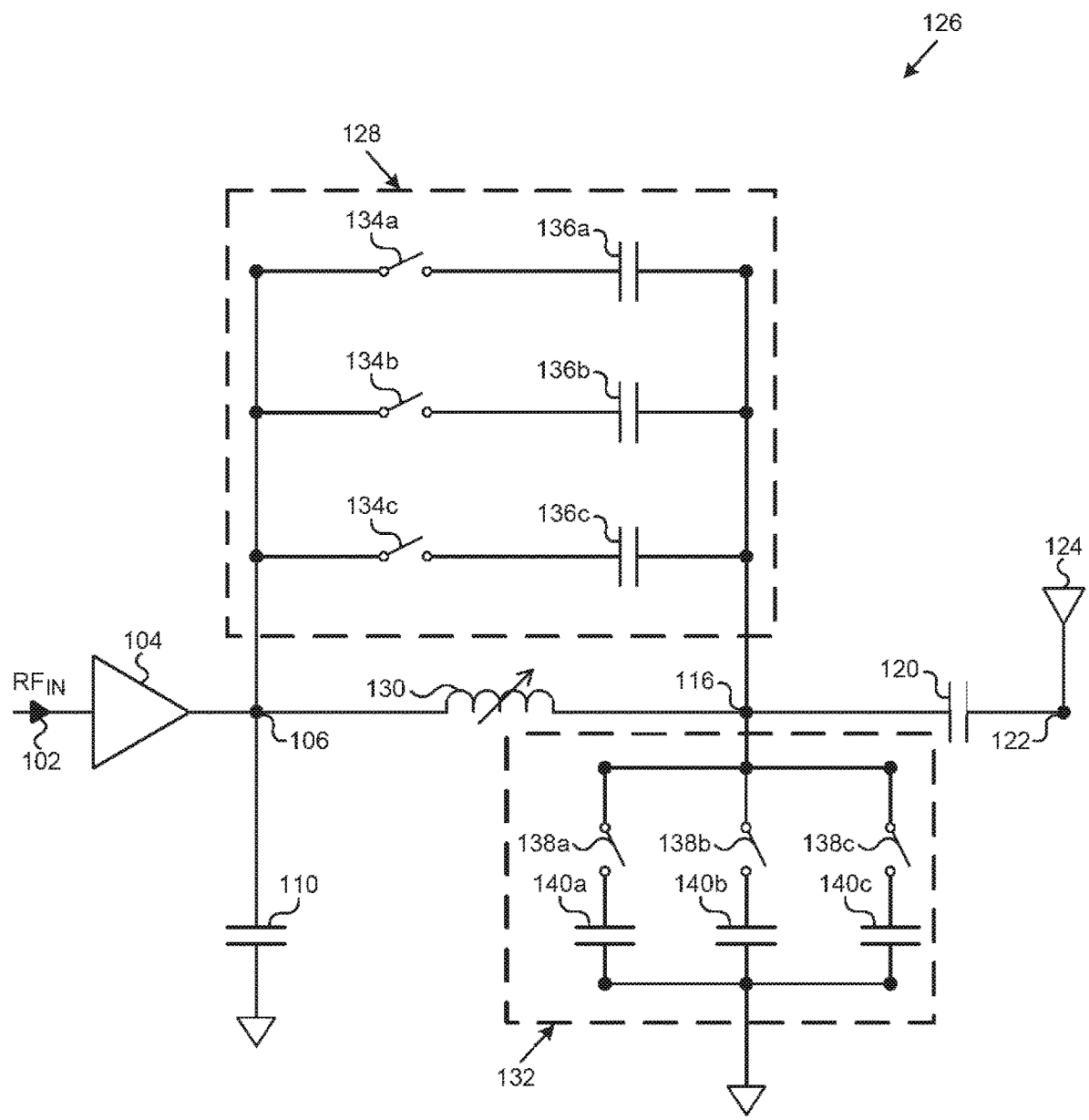
FIG. 2 illustrates a portion of an RF module including a non-volatile tunable RF filter employing non-volatile RF switches according to one implementation of the present application.

FIG. 2 illustrates a portion of an RF module including a non-volatile tunable RF filter employing non-volatile RF switches according to one implementation of the present application. The RF module includes RF input 102, amplifier 104 having output 106, non-volatile tunable RF filter 126, and RF module output 122. Non-volatile tunable RF filter 126 includes fixed capacitors 110 and 120, adjustable capacitors 128 and 132, and adjustable inductor 130. Output 122 of the RF module is coupled to antenna 124.

As shown in FIG. 2, non-volatile tunable RF filter 126 includes adjustable capacitors 128 and 132. Adjustable capacitor 128 includes non-volatile RF switches 134a, 134b, and 134c and fixed capacitors 136a, 136b, and 136c. Non-volatile RF switches 134a, 134b, and 134c are coupled between the output 106 of amplifier 104 and respective fixed capacitors 136a, 136b, and 136c. Fixed capacitors 136a, 136b, and 136c are coupled between respective non-volatile RF switches 134a, 134b, and 134c and node 116. Similarly, adjustable capacitor 132 includes non-volatile RF switches 138a, 138b, and 138c and fixed capacitors 140a, 140b, and 140c. Non-volatile RF switches 138a, 138b, and 138c are coupled between node 116 and respective fixed capacitors 140a, 140b, and 140c. Fixed capacitors 140a, 140b, and 140c are coupled between respective non-volatile RF switches 138a, 138b, and 138c and ground. As described below, in one implementation, non-volatile RF switches 134a, 134b, 134c, 138a, 138b, and 138c are phase-change material (PCM) RF switches. In other implementations, non-volatile RF switches 134a, 134b, 134c, 138a, 138b, and 138c can be any non-volatile switch known in the art.

Adjustable capacitor 128 can be adjusted when non-volatile RF switches 134a, 134b, and 134c are in ON states or OFF states. For example, when non-volatile RF switch 134a is in an ON state, fixed capacitor 136a is engaged and a first capacitance value can be achieved by adjustable capacitor 128. Likewise, when non-volatile RF switch 134b or 134c is in an ON state, fixed capacitor 136b or 136c is engaged and second or third capacitance values can be achieved by adjustable capacitor 128. When two or three of non-volatile RF switches 134a, 134b, and 134c are in an ON state, two or three of fixed capacitors 136a, 136b, and 136c are engaged in parallel, and additional capacitance values can be achieved by adjustable capacitor 128. Similarly, adjustable capacitor 132 can be adjusted when non-volatile RF switches 138a, 138b, and 138c are in ON states or OFF states, where fixed capacitors 140a, 140b, and 140c are engaged or disengaged.

As used in the present application, "engaged" refers to having a very low resistance electrical connection to other parts of a circuit through a connecting non-volatile RF switch, e.g., when non-volatile RF switches 134a, 134b, and 134c in the paths of fixed capacitors 136a, 136b, and 136c are in ON (very low resistance) states. Further, "disengaged" refers to when non-volatile RF switches 134a, 134b, and 134c are in OFF (very high resistance) states.

In various implementations, fixed capacitors 136a, 136b, 136c, 140a, 140b, and 140c can have the same nominal capacitance values as each other or different nominal capacitance values. In various implementations adjustable capacitors 128 and 132 can have more or fewer than three fixed capacitors each. In various implementations, fixed capacitors 136a, 136b, 136c, 140a, 140b, and 140c can be concurrently engaged by two corresponding non-volatile RF switches. In various implementations, a non-volatile RF switch can be coupled to more than one fixed capacitor. In one implementation, adjustable inductor 130 can be implemented using non-volatile RF switches and fixed inductors (not shown in FIG. 2). Non-volatile tunable RF Filter 126 can include more or fewer adjustable capacitors and/or adjustable inductors having various arrangements.

Unlike RF filter 108 in FIG. 1, non-volatile tunable RF filter 126 in FIG. 2 is tunable after fabrication. That is, adjustable capacitors 128 and 132 can be adjusted even after fabrication of non-volatile tunable RF filter 126 by changing states of non-volatile RF switches 134a, 134b, 134c, 138a, 138b, and 138c. Where fixed capacitors 112 and 118 in FIG. 1 may cause RF filter 108 to fail to substantially pass desired frequencies (e.g. a fundamental frequency) and/or fail to substantially reject undesired frequencies (e.g., a second harmonic frequency), adjustable capacitors 128 and 132 in FIG. 2 can be adjusted even after fabrication of the RF filter such that non-volatile tunable RF filter 126 substantially passes desired frequencies and substantially rejects undesired frequencies. As such, non-volatile tunable RF filter 126 overcomes difficulties associated with process variations to make an otherwise non-compliant RF module compliant, thus reducing the percentage of semiconductor dies, products, or consumer electronic devices that might be discarded due to an otherwise non-compliant RF module, and significantly improving product yield.

Importantly, because non-volatile tunable RF filter 126 utilizes non-volatile RF switches 134a, 134b, 134c, 138a, 138b, and 138c, desirable values for adjustable capacitors 128 and 132 can be determined and then set in a factory even after fabrication of the RF filter. Using techniques described below, factory settings for adjustable capacitors 128 and 132 may be determined even after fabrication of the RF module such that non-volatile tunable RF filter 126 substantially rejects undesired frequencies and substantially passes desired frequencies. As used in the present application, a "factory setting" corresponds to a combination of factory-set states of non-volatile RF switches 134a, 134b, 134c, 138a, 138b, and 138c. Using techniques described below, the states of non-volatile RF switches 134a, 134b, 134c, 138a, 138b, and 138c can be set at the factory during testing (and after fabrication) of the RF module. These factory-set states can then be permanently retained even without applied power and even after the RF module is utilized in a product or a consumer electronic device (e.g. a mobile phone) by an end-user. Further, an end-user can be prevented from accessing non-volatile RF switches 134a, 134b, 134c, 138a, 138b, and 138c, so as to prevent the end-user from modifying these factory-set states. Non-volatile RF switches 134a, 134b, 134c, 138a, 138b, and 138c will not need to draw power after their states have been changed in a factory. Thus, a battery-powered consumer electronic device employing the RF module in FIG. 2 can operate longer and/or at higher voltages or currents.

Figure 3:
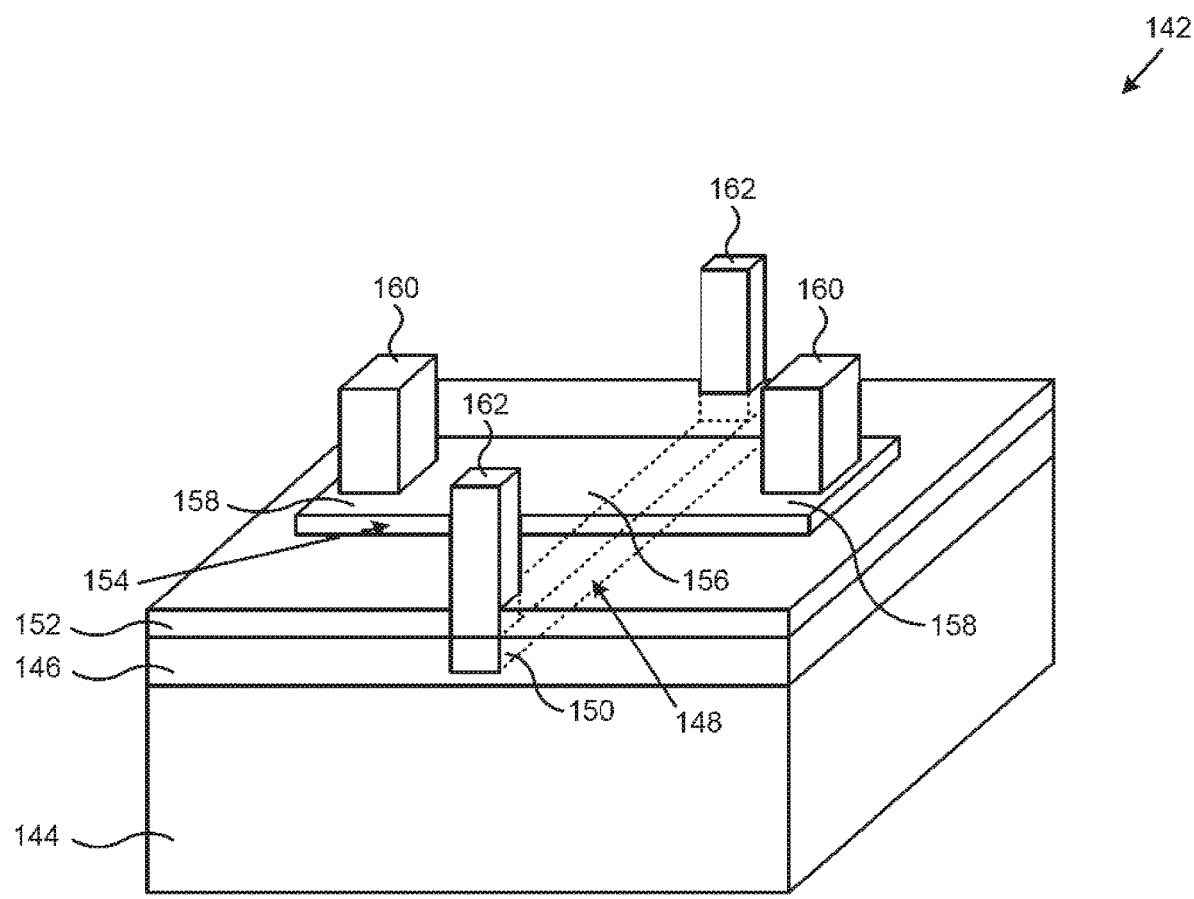
FIG. 3 illustrates a perspective view of a portion of a phase-change material (PCM) RF switch according to one implementation of the present application.

FIG. 3 illustrates a perspective view of a portion of a phase-change material (PCM) RF switch according to one implementation of the present application PCM RF switch 142 is an example of one type of non-volatile RF switch according to the present application. For example, PCM RF switch 142 in FIG. 3 may be used as any of non-volatile RF switches 134a, 134b, 134c, 138a, 138b, and 138c in FIG. 2. As shown in FIG. 3, PCM RF switch 142 includes substrate 144, lower dielectric 146, heating element 148 having terminal segments 150, thermally conductive and electrically insulating material 152, PCM 154 having active segment 156 and passive segments 158, PCM contacts 160, and heater contacts 162. For purposes of illustration, the perspective view in FIG. 3 shows selected structures of PCM RF switch 142. PCM RF switch 142 may include other structures not shown in FIG. 3.

Substrate 144 is situated under lower dielectric 146. In one implementation, substrate 144 is an insulator, such as silicon oxide ($SiO_2$). In various implementations, substrate 144 is a silicon (Si), silicon-on-insulator (SOI), sapphire, complementary metal-oxide-semiconductor (CMOS), bipolar CMOS (BiCMOS), or group III-V substrate. In various implementations, substrate 144 includes a heat spreader or substrate 144 itself performs as a heat spreader. Substrate 144 can have additional layers (not shown in FIG. 3). In one implementation, substrate 144 can comprise a plurality of interconnect metal levels and interlayer dielectric layers. Substrate 144 can also comprise a plurality of devices, such as integrated passive devices (not shown in FIG. 3).

Lower dielectric 146 in PCM RF switch 142 is situated above substrate 144 and below thermally conductive and electrically insulating material 152. As shown in FIG. 3, lower dielectric 146 is also adjacent to sides of heating element 148. Lower dielectric 146 extends along the width of PCM RF switch 142, and is also coplanar with the top of heating element 148. Because PCM RF switch 142 includes lower dielectric 146 on the sides of heating element 148, less heat transfers horizontally (i.e., from the sides) and more heat dissipates vertically from heating element 148 toward active segment 156 of PCM 154. In various implementations, lower dielectric 146 can have a relative width and/or a relative thickness greater or less than shown in FIG. 3. Lower dielectric 146 can comprise any material with thermal conductivity lower than that of thermally conductive and electrically insulating material 152.

Heating element 148 in PCM RF switch 142 is situated in lower dielectric 146. Heating element 148 also approximately defines active segment 156 of PCM 154. Heating element 148 generates a crystallizing heat pulse or an amorphizing heat pulse for transforming active segment 156 of PCM 154. Heating element 148 can comprise any material capable of Joule heating. Heating element 148 can be connected to electrodes of a pulse generator (not shown in FIG. 3) that generates voltage or current pulses. Preferably, heating element 148 comprises a material that exhibits minimal or substantially no electromigration, thermal stress migration, and/or agglomeration. In various implementations, heating element 148 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 148 comprises tungsten lined with titanium and titanium nitride.

Thermally conductive and electrically insulating material 152 in PCM RF switch 142 is situated on top of heating element 148 and lower dielectric 146, and under PCM 154 and, in particular, under active segment 156 of PCM 154. Thermally conductive and electrically insulating material 152 ensures efficient heat transfer from heating element 148 toward active segment 156 of PCM 154, while electrically insulating heating element 148 from PCM contacts 160, PCM 154, and other neighboring structures.

Thermally conductive and electrically insulating material 152 can comprise any material with high thermal conductivity and high electrical resistivity. In various implementations, thermally conductive and electrically insulating material 152 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 152 can be a nugget that does not extend along the width of PCM RF switch 142. For example, thermally conductive and electrically insulating material 152 can be a nugget approximately aligned with heating element 148.

PCM 154 in PCM RF switch 142 is situated on top of thermally conductive and electrically insulating material 152. PCM RF switch 142 utilizes PCM 154 to transfer input RF signals in an ON state and to block input RF signals in an OFF state. PCM 154 includes active segment 156 and passive segments 158. Active segment 156 of PCM 154 is approximately defined by heating element 148. Passive segments 158 of PCM 154 extend outward and are transverse to heating element 148, and are situated approximately under PCM contacts 160. As used in the present application, "active segment" refers to a segment of PCM that transforms between crystalline and amorphous phases, for example, in response to a crystallizing or an amorphizing heat pulse generated by heating element 148, whereas "passive segment" refers to a segment of PCM that does not make such transformation and maintains a crystalline phase (i.e., maintains a conductive state).

With proper heat pulses and heat dissipation, active segment 156 of PCM 154 can transform between crystalline and amorphous phases, allowing PCM RF switch 142 to switch between ON and OFF states respectively. Active segment 156 of PCM 154 must be heated and rapidly quenched in order for PCM RF switch 142 to switch states. If active segment 156 of PCM 154 docs not quench rapidly enough, it will not transform, and PCM RF switch 142 will fail to switch slates. How rapidly active segment 156 of PCM 154 must be quenched depends oil the material, volume, and temperature of PCM 154. In one implementation, the quench time window can be approximately one hundred nanoseconds (100 ns) or greater or less.

PCM 154 can comprise germanium telluride ($Ge_XTe_Y$), germanium antimony telluride ($Ge_XSb_Y Te_Z$), germanium selenide ($Ge_XSe_Y$), or any oilier chalcogenide. In various implementations, PCM 154 can be germanium telluride having from forty percent to sixty percent germanium by composition (i.e., $Ge_XTe_Y$, where $0.4 \leq X \leq 0.6$ and $Y=1-X$). The material for PCM 154 can be chosen based upon ON state resistivity, OFF state electric field breakdown voltage, crystallization temperature, melting temperature, or other considerations. It is noted that in FIG. 3, heating element 148 is transverse to PCM 154. Heating element 148 is illustrated with dashed lines as seen through various structures of PCM RF switch 142. Current flowing in heating element 148 flows approximately under active segment 156 of PCM 154.

PCM contacts 160 in PCM RF switch 142 are connected to passive segments 158 of PCM 154. Similarly, heater contacts 162 are connected to terminal segments 150 of heating element 148. PCM contacts 160 provide RF signals to and from PCM 154. Heater contacts 162 provide power to heating element 148 for generating a crystallizing heat pulse or an amorphizing heat pulse. In various implementations, PCM contacts 160 and heater contacts 162 can comprise tungsten (W), copper (Cu), or aluminum (Al). PCM contacts 160 and heater contacts 162 can extend through various dielectric layers (not shown in FIG. 3). In one implementation, in order to ensure uniform contact between PCM 154 and PCM contacts 160, PCM contacts 160 can extend through a contact uniformity support layer (not shown in FIG. 3) situated on top of PCM 154, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

Due to its structure, PCM RF switch 142 has very low insertion loss at radio frequencies. In particular, PCM 154 in the crystalline state has low resistivity, while PCM 154 in the amorphous state has high resistivity. In various implementations, the OFF state resistance ($R_{OFF}$) of PCM RF switch 142 can range from approximately ten kilo-Ohms to approximately one mega-Ohm (10 kΩ–1 MΩ), while the ON state resistance ($R_{ON}$) of PCM RF switch 142 can be approximately one Ohm (1Ω) or less. The low insertion of PCM RF switch 142 is particular advantageous for RF filtering. An RF filter, such as non-volatile tunable RF filter 126 in FIG. 2, can employ more PCM RF switches 142 in order to tune its frequency response in more combinations, without insertion losses prohibiting proper RF filtering.

In addition to having low insertion loss, PCM RF switch 142 is advantageously non-volatile. That is, PCM 154 maintains its crystalline (ON state) or amorphous phase (OFF state) even when power is not supplied to heating element 148. PCM RF switch 142 requires less power than conventional switches when remaining in an ON state. Also, PCM RF switch 142 is resilient to voltage fluctuations in its programming, making PCM RF switch 142 particularly applicable in antenna tuners and other circuits which might experience large voltage fluctuations.

Figure 4:
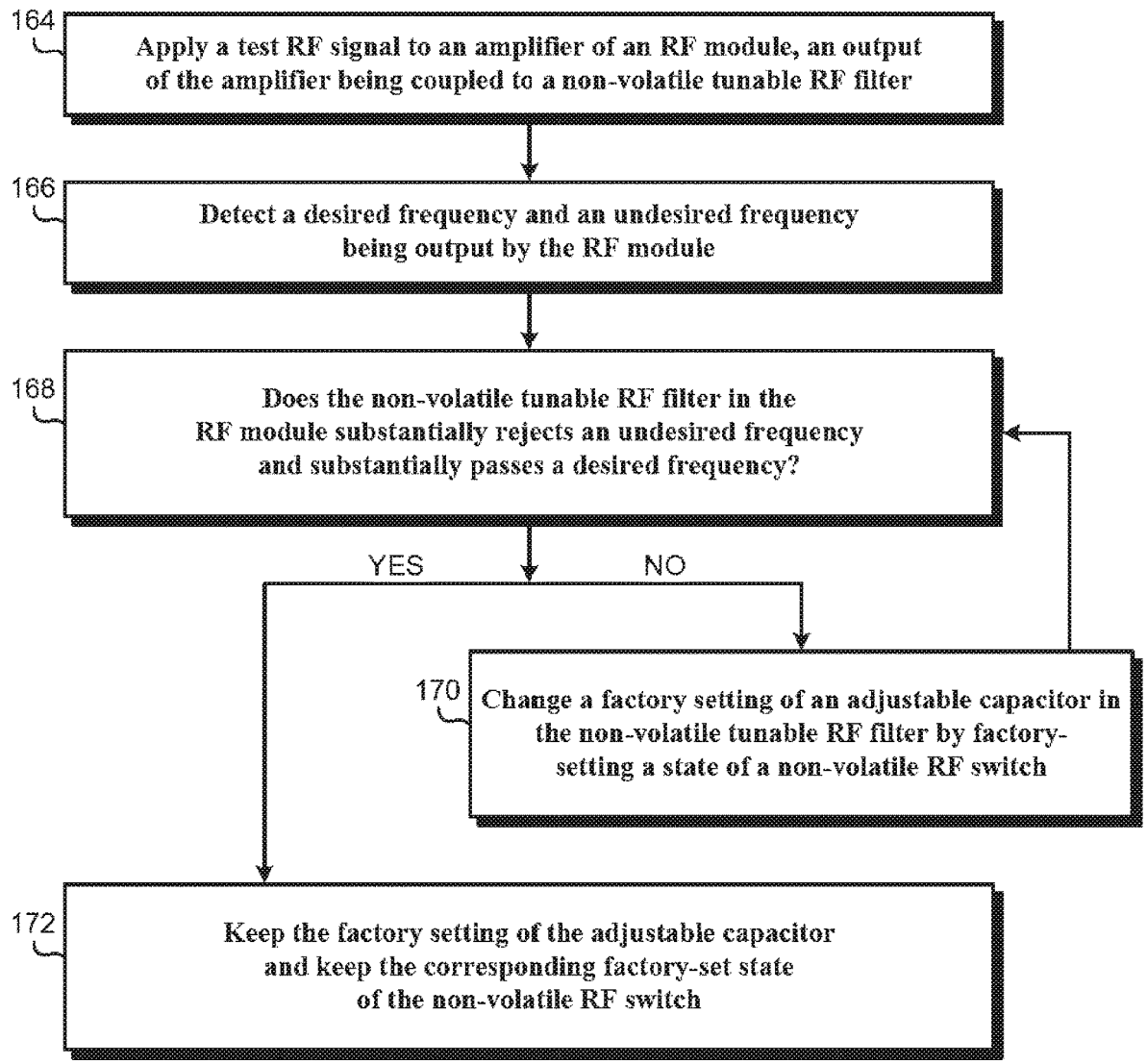
FIG. 4 is a flowchart of an exemplary method for tuning an RF module having a non-volatile tunable RF filter according to one implementation of the present application.
Figure 6:
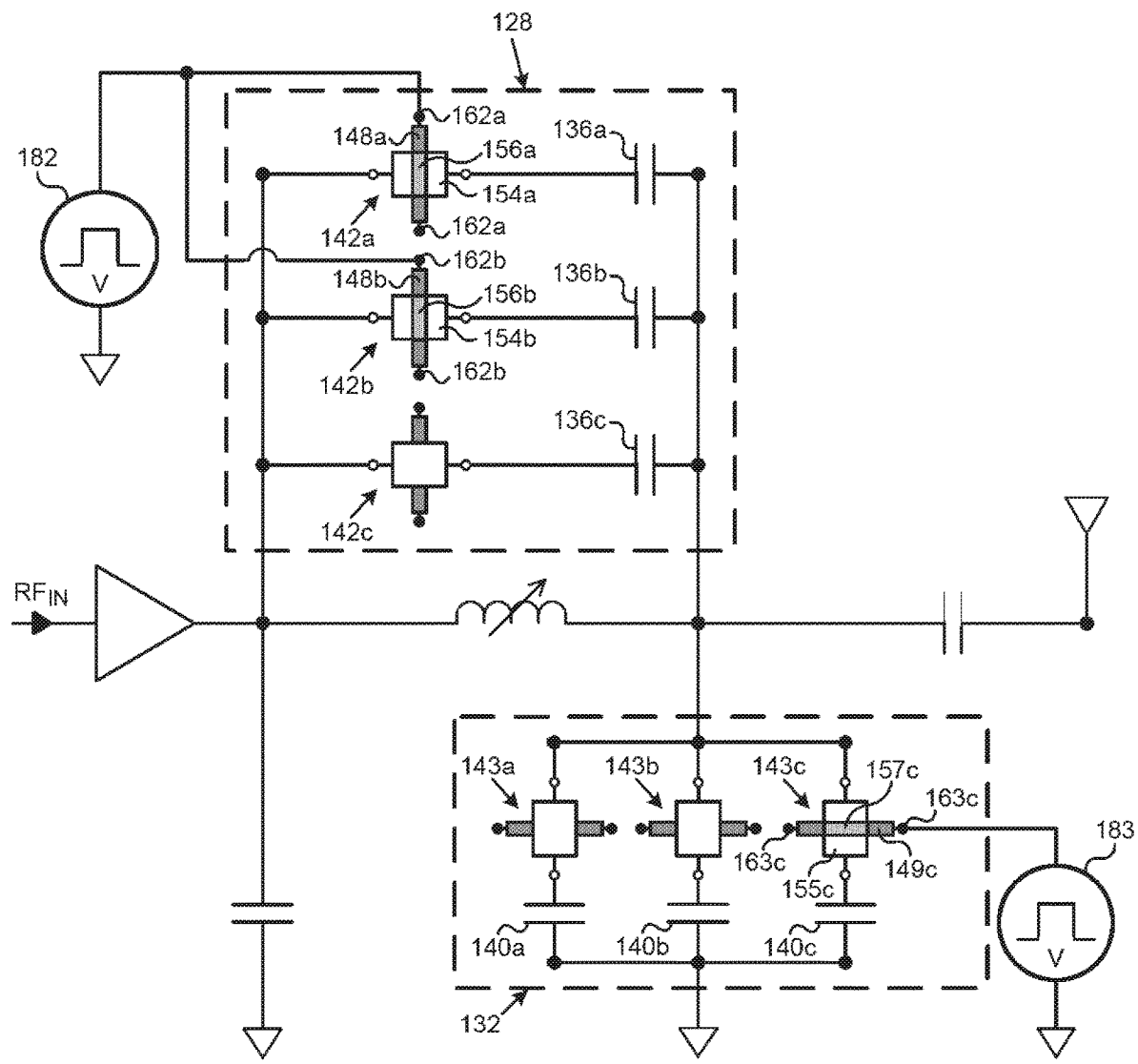
FIG. 6 illustrates a portion of an RF module processed in accordance with the flowchart in FIG. 4 according to one implementation of the present application.
Figure 7:
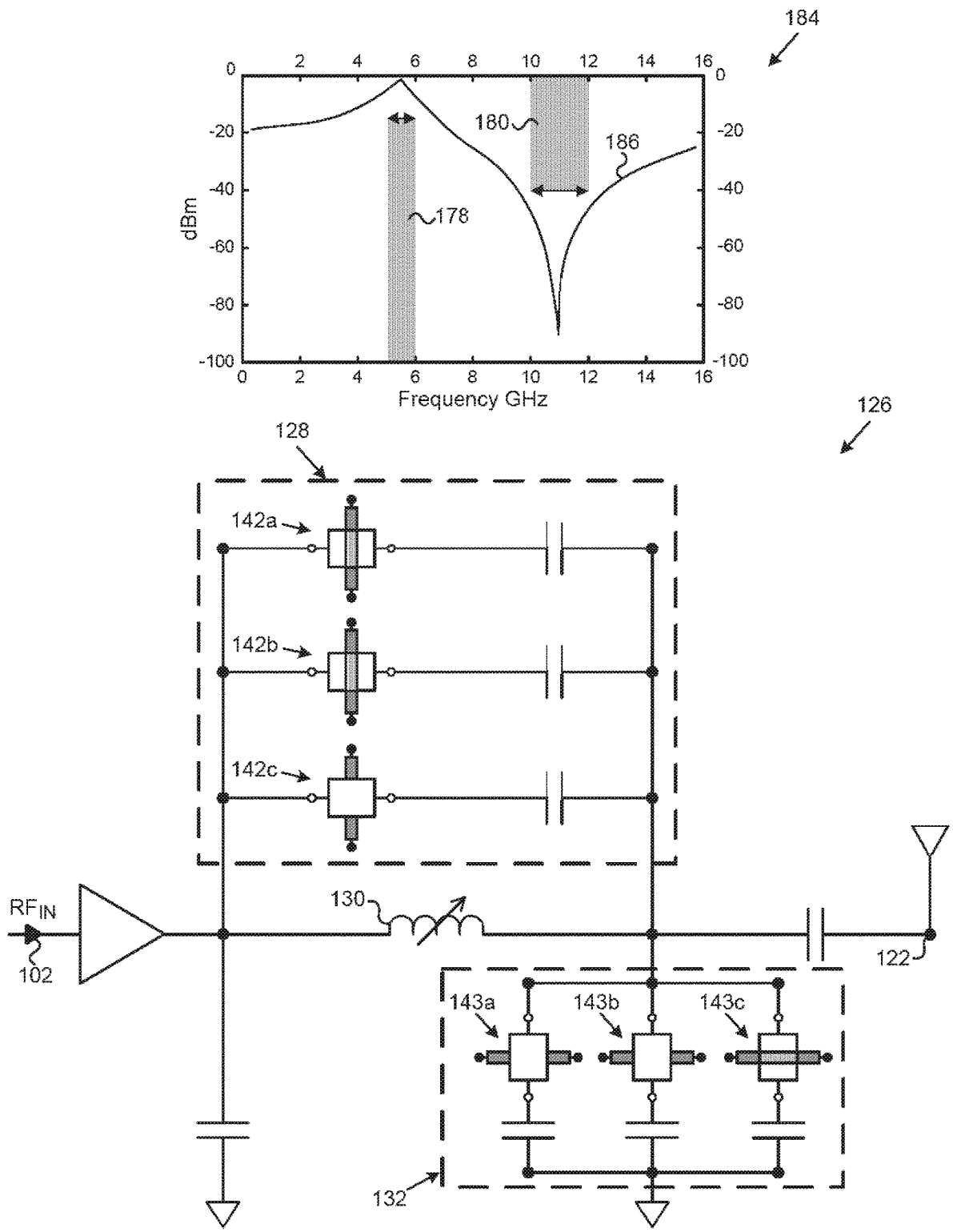
FIG. 7 illustrates a portion of an RF module and a corresponding frequency response graph processed in accordance with the flowchart in FIG. 4 according to one implementation of the present application.

FIG. 4 illustrate a flowchart of an exemplary method for timing an RF module having a non-volatile tunable RF Alter according to one implementation of the present application. Structures shown in FIGS. 5 through 7 illustrate the results of performing the method according to the flowchart in FIG.

4. Actions 164, 166, 168, 170, and 172 shown in the flowchart in FIG. 4 are sufficient to describe one implementation of the present inventive concepts. Other implementations of the present inventive concepts may utilize actions different from those shown in the flowchart of FIG. 4. Certain details and features have been left out of the flowchart that are apparent to a person of ordinary skill in the art. For example, an action may consist of one or more sub-actions or may involve specialized equipment or materials, as known in the art. Moreover, some actions are omitted so as not to distract from the illustrated actions.

Figure 5:
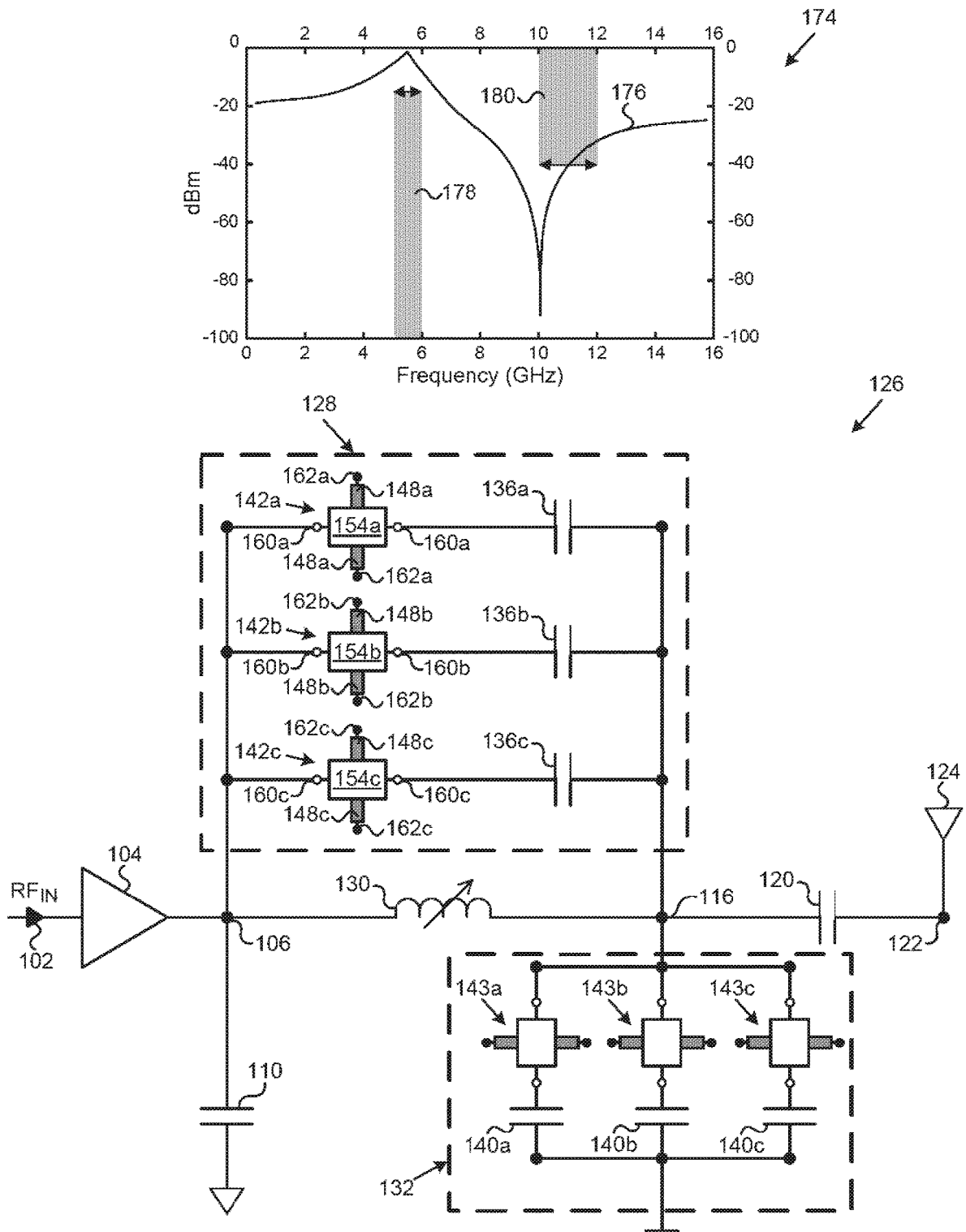
FIG. 5 illustrates a portion of an RF module and a corresponding frequency response graph processed in accordance with the flowchart in FIG. 4 according to one implementation of the present application.

FIG. 5 illustrates a portion of an RF module and a corresponding frequency response graph processed in accordance with actions 164, 166, and 168 in the flowchart in FIG. 4 according to one implementation of the present application. The RF module includes RF input 102, amplifier 104 having output 106, non-volatile tunable RF filter 126, and RF module output 122. Non-volatile tunable RF filter 126 includes fixed capacitors 110 and 120, adjustable capacitors 128 and 132, and adjustable inductor 130. Output 122 of the RF module is coupled to antenna 124.

The RF module in FIG. 5 is similar to the RF module in FIG. 2, except dial, in adjustable capacitors 128 and 132, non-volatile RF switches 134a, 134b, 134c, 138a, 138b, and 138c in FIG. 2 are shown as PCM RF switches 142a, 142b, 142c, 143a, 143b, and 143c in FIG. 5. PCM RF swatches 142a, 142b, and 142c include respective heating elements 148a, 148b, and 148c, respective PCMs 154a 154b and 154c, respective PCM contacts 160a, 160b, and 160c, and respective heater contacts 162a, 162b, and 162c. PCM contacts 160a, 160b, and 160c are coupled to output 106 of amplifier 104 and to respective fixed capacitors 136a, 136b, and 136c. In a similar fashion, PCM RF switches 143a, 143b, and 143c are coupled to node 116 and respective fixed capacitors 140a, 140b, and 140c. PCM RF switches 142a, 142b, 142c, 143a, 143b, and 143c in FIG. 5 generally correspond to PCM RF switch 142 in FIG. 3, and may have any implementations or advantages described above.

PCMs 154a, 154b, and 154c are situated over and are transverse to respective heating elements 148a, 148b, and 148c. As described above, heater contacts 162a, 162b, and 162c can provide power to respective heating elements 148a, 148b, and 148c for generating crystallizing heat pulses or amorphizing heat pulses for transforming respective active segments of respective PCMs 154a, 154b, and 154c between crystalline and amorphous phases, thereby switching respective PCM RF switches 142a, 142b, and 142c between ON and OFF states. However in FIG. 5, heater contacts 162a, 162b, and 162c are not coupled to a power source and are floating. In a similar fashion, PCM RF switches 143a, 143b, and 143c are not coupled to a power source.

In FIG. 5, PCM RF switches 142a, 142b, and 142c, are in ON states. PCMs 154a, 154b, and 154c are in a crystalline phases, have low resistivity, and are able to easily conduct electrical current. A signal at output 106 of amplifier 104 propagates across PCM RF switches 142a, 142b, and 142c through respective first PCM contacts 160a, 160b, and 160c, through respective PCMs 154a, 154b, and 154c, and through respective second PCM contacts 160a, 160b, and 160c, to respective fixed capacitors 136a, 136b, and 136c. Accordingly, all three of fixed capacitors 136a, 136b, and 136c are engaged. In a similar fashion, all three of fixed capacitors 140a, 140b, and 140c are engaged.

Referring to the flowchart in FIG. 4, the flowchart begins at action 164 with applying a test RF signal to an amplifier of an RF module. A test RF signal can be applied to amplifier 104 of the RF module in FIG. 5, for example, by connecting a signal generator at RF input 102. In various implementations, the test RF signal can be a frequency sweep or a multi-frequency impulse.

The flowchart in FIG. 4 continues at action 166 with detecting a desired frequency and an undesired frequency being output by the RF module. The frequencies being output by the RF module in FIG. 5 can be detected, for example, by connecting a meter to output 122 of the RF module. In another implementation, frequencies being output by the RF module in FIG. 5 can be detected using a receiver antenna in proximity to antenna 124. Actions 164 and 166 can be performed at the factory by an automated test equipment (ATE).

Frequency response graph 174 in FIG. 5 illustrates the results of performing actions 164 and 166 in the flowchart in FIG. 4 on the RF module in FIG. 5. Trace 176 in frequency response graph 174 illustrates the power at output 122 of the RF module, measured in decibel-milliwatts, versus the frequency, in gigahertz, applied at RF input 102. As shown in frequency response graph 174, trace 176 has a maximum near approximately five and a half gigahertz (5.5 GHz) and a minimum near approximately ten gigahertz (10 GHz).

The flowchart in FIG. 4 continues at action 168 with determining whether the non-volatile tunable RF filter in the RF module substantially rejects an undesired frequency and substantially passes a desired frequency. Frequency response graph 174 can be used to determine whether non-volatile tunable RF filter 126 in the RF module in FIG. 5 substantially rejects an undesired frequency and substantially passes a desired frequency. Continuing the above example, non-volatile tunable RF filter 126 may have been designed to substantially pass desired frequencies between five gigahertz and six gigahertz (5 GHz-6 GHz), and to substantially reject undesired frequencies between ten gigahertz and twelve gigahertz (10 GHz-12 GHz). In the present example, the desired frequencies may correspond to fundamental frequencies in a wireless communication standard, such as WLAN. The undesired frequencies may correspond to second harmonic frequencies in the wireless communication standard.

Non-volatile tunable RF filter 126 may fail to substantially pass the desired frequencies when a power level is below negative fifteen decibel-milliwatts (−15 dBm). Region 178 in frequency response graph 174 indicates the corresponding region where non-volatile tunable RF filter 126 may fail to substantially pass the desired frequencies. Since trace 176 is clear of region 178, it can be determined that non-volatile tunable RF filler 126 successfully substantially passes the desired frequencies.

Non-volatile tunable RF filter 126 may fail to substantially reject undesired frequencies when a power level is above negative forty-two decibel-milliwatts (−42 dBm). Region 180 in frequency response graph 174 indicates the corresponding region where non-volatile tunable RF filter 126 may fail to substantially reject the undesired frequencies. Since trace 176 intersects region 180, it can be determined that non-volatile tunable RF filter 126 does not substantially reject the undesired frequencies. In various implementations, any other frequencies may be desired or undesired, and any other power levels may be used to determine whether non-volatile tunable RF filter 126 substantially passes or substantially rejects frequencies.

FIG. 6 illustrates a portion of an RF module processed in accordance with action 170 in the flowchart in FIG. 4 according to one implementation of the present application, hi the present example, because non-volatile tunable RF filter 126 did not substantially reject the undesired frequencies in FIG. 5, the flowchart in FIG. 4 continues at action 170 with changing a factory setting of an adjustable capacitor in the non-volatile tunable RF filter by factory-setting a state of a non-volatile RF switch.

In FIG. 6, while the RF module is still in the factory, pulse generator 182 is coupled to first heater contacts 162a and 162b in respective PCM RF switches 142a and 142b in adjustable capacitor 128. Second heater contacts 162a and 162b can be coupled to ground (not shown in FIG. 6). Pulse generator 182 generates electrical pulses and provides power to heating elements 148a and 148b. Heating elements 148a and 148b generate amorphizing heat pulses and transform respective active segments 156a anti 156b of respective PCMs 154a and 154b to amorphous phases that do not easily conduct electrical current. Accordingly. PCM RF switches 142a and 142b in FIG. 6 are switched to OFF states, and fixed capacitors 136a and 136b are disengaged PCM RF switch 142c is not coupled to pulse generator 182, and fixed capacitor 136c remains engaged. Unlike in FIG. 5, where all three of fixed capacitors 136a, 136b, and 136c were engaged in adjustable capacitor 128, in FIG. 6, only fixed capacitor 136c is engaged in adjustable capacitor 128. Thus, pulse generator 182 factory-sets the states of PCM RF switches 142a and 142b and correspondingly adjusts the factory setting of adjustable capacitor 128.

Similarly, while the RF module is still in the factory, pulse generator 183 is coupled to a first one of heater contacts 163c in PCM RF switch 143c in adjustable capacitor 132. A second one of heater contacts 163c can be coupled to ground (not shown in FIG. 6). Pulse generator 183 generates electrical pulses and provides power to heating element 149c. Heating element 149c generates an amorphizing heat pulse and transforms active segment 157c of PCM 155c to an amorphous phase that does not easily conduct electrical current. Accordingly, PCM RF switch 143c in FIG. 6 is switched to an OFF state, and fixed capacitor 140c is disengaged. PCM RF switches 143a and 143b are not coupled to pulse generator 183, and fixed capacitors 140a and 140b remain engaged. Unlike in FIG. 5, where all three of fixed capacitors 140a, 140b, and 140c were engaged in adjustable capacitor 132, in FIG. 6, two fixed capacitors 140a and 140b are engaged in adjustable capacitor 132. Thus, pulse generator 183 factory-sets the state of PCM RF switch 143c and correspondingly adjusts the factory setting of adjustable capacitor 132.

In one implementation, pulse generators 182 and 183 may utilize factor probes for selectively applying electrical pulses to heater contacts of the PCM RF switches during wafer level testing or the level testing prior to packaging. Alternatively, pulse generators 182 and 183 may utilize test pins or functional pins to selectively apply electrical pulses to heater contacts of the PCM RF switches during testing of packaged dies. Although pulse generators 182 and 183 are illustrated as voltage generators in FIG. 6, in one implementation, pulse generators 182 and 183 can be current generators. Although pulse generator 182 is illustrated as being shared by PCM RF switches 142a and 142b, in one implementation, pulse generator 182 may comprise multiple pulse generators connected to respective PCM RF switches. A similar alternative implementation can be used for pulse generator 183. In another implementation, pulse generator 182 may be a single pulse generator that is coupled to PCM RF switches 142a and 142b one at a time (e.g., coupled to PCM RF switch 142a first, decoupled therefrom, and then coupled to PCM RF switch 142b). Again, a similar alternative implementation can be used for pulse generator 183.

Although FIG. 6 illustrates concurrently setting the states of three PCM RF switches 142a, 142b, and 143c, more or fewer states can be set at a time.

FIG. 7 illustrates a portion of an RF module and a corresponding frequency response graph processed in accordance with actions 168 and 172 in the flowchart in FIG. 4 according to one implementation of the present application. In FIG. 7, pulse generators 182 and 183 (shown in FIG. 6) are no longer coupled to PCM RF switches 142a 142b and 143c.

In frequency response graph 184, trace 186 illustrates the power at output 122 of the RF module, measured in decibel-milliwatts, versus the frequency, in gigahertz, applied at RF input 102. As shown by trace 186, the RF module in FIG. 7 exhibits a different frequency response compared to the RF module in FIG. 5, because in FIG. 7 PCM RF switches 142a 142b and 143c are in OFF states and the factory settings of adjustable capacitors 128 and 132 have been changed. In frequency response graph 184, trace 186 has a maximum near approximately five and a half gigahertz (5.5 GHz) and a minimum near approximately eleven gigahertz (11 GHz). Compared to the profile of trace 176 in FIG. 5, the profile of trace 186 in FIG. 7 around its minimum is shifted to the right.

Because the factory settings of adjustable capacitors 128 and 132 were changed in FIG. 6, the flowchart in FIG. 4 continues at action 168 with determining whether the non-volatile tunable RF filter in the RF module substantially rejects an undesired frequency and substantially passes a desired frequency. In FIG. 7, frequency response graph 184 can be used to determine whether non-volatile tunable RF Filter 126 in the RF module in FIG. 7 now substantially rejects an undesired frequency and substantially passes a desired frequency. Since trace 186 is clear of region 178, it can be determined that non-volatile tunable RF filter 126 in FIG. 7 successfully substantially passes the desired frequencies. Since trace 186 no longer intersects and is clear of region 180, it can be determined that non-volatile tunable RF filter 126 in FIG. 7 also now successfully substantially rejects the undesired frequencies.

In various implementations, the factory settings of adjustable capacitors 128 and 132 may need to be changed multiple times before non-volatile tunable RF filter 126 successfully substantially rejects the undesired frequencies. In other words, several iterations of actions 168 and 170 in the flowchart in FIG. 4 may be performed. In one implementation, a factory setting of adjustable inductor 130 can be changed instead of or ill addition to adjustable capacitors 128 and 132, using a method similar to the one illustrated by the flowchart in FIG. 4.

Because the non-volatile tunable RF filter 126 substantially rejects an undesired frequency and substantially passes a desired frequency in FIG. 7, the RF module has been successfully factory tuned, and the flowchart in FIG. 4 ends at action 172 with keeping the factory setting of the adjustable capacitor and keeping the corresponding factory-set state of the non-volatile RF switch, and optionally continuing fabrication. To ensure that the factory settings of adjustable capacitors 128 and 132 are kept when the RF module is used by an end-user, an end-user can be prevented access to PCM RF switches 142a, 142b, 142c, 143a, 143b, and 143c, so as to prevent the end-user from modifying their factory-set states.

For example, PCM RF switches 142a, 142b, 142c, 143a, 143b, and 143c may be completely sealed off by packaging. As another example, PCM RF swatches 142a, 142b, 142c, 143a, 143b, and 143c may be partially sealed off by packaging, and a special interface may be needed to couple to or change the factory-set states of PCM RF switches 142a, 142b, 142c, 143a, 143b, and 143c. As yet another example, in a consumer electronic device a controller may prevent a pulse generator from coupling to or providing power to PCM RF switches 142a, 142b, 142c, 143a, 143b, and 143c without hardware or software unlock codes.

As used in the present application, an end-user being "prevented access" does not necessarily require access be completely or absolutely prevented. Rather, it simply means the factory-set states of PCM RF switches cannot be modified by the end-user in the ordinary course of use of an RF module, for example, by using a pulse generator to provide power to PCM RF switches 142a, 142b, 142c, 143a, 143b, and 143c. Also, as used in the present application, "factory-setting" a state of a non-volatile RF switch does not necessarily require an action to be performed at a factory. Rather, factory-setting can be performed anywhere outside the end-user's ordinary course of use of the RF module. For example, factory-setting can be performed at a service center for consumer electronic devices, or at a self-service kiosk. Further, as used in the present application, "factory-setting" does require the setting to be irreversible. Indeed, a significant advantage of using nonvolatile RF switches, such as PCMRF switches 142a, 142b, 142c, 143a, 143b, and 143c, is that, in addition to retaining their states in a non-volatile manner during power off, they are multiple-times-programmable.

Figure 8:
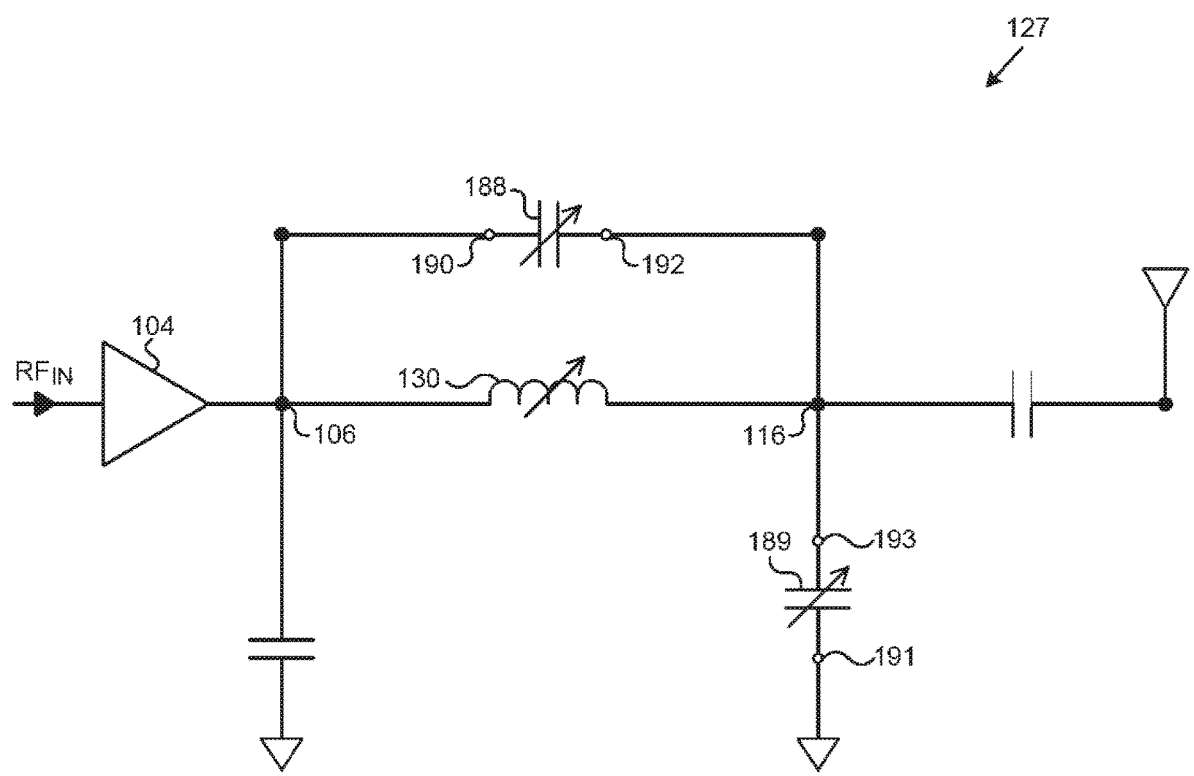
FIG. 8 illustrates a portion of an RF module including a non-volatile tunable RF filter employing an adjustable capacitor according to one implementation of the present application.

FIG. 8 illustrates a portion of an RF module including a non-volatile tunable RF filter employing an adjustable capacitor according to one implementation of the present application. The RF module in FIG. 8 is similar to the tunable RF module in FIG. 2, except that, where non-volatile tunable RF filter 126 in FIG. 2 included adjustable capacitors 128 and 132, non-volatile tunable RF filter 127 in FIG. 8 includes adjustable capacitors 188 and 189. As described below adjustable capacitors 188 and 189 employ non-volatile RF switches to engage and disengage selectable segments. Adjustable capacitor 188 includes terminals 190 coupled to output 106 of amplifier 104 and terminal 192 coupled to node 116. Adjustable capacitor 189 includes terminal 191 coupled to ground and terminal 193 coupled to node 116.

Figure 9:
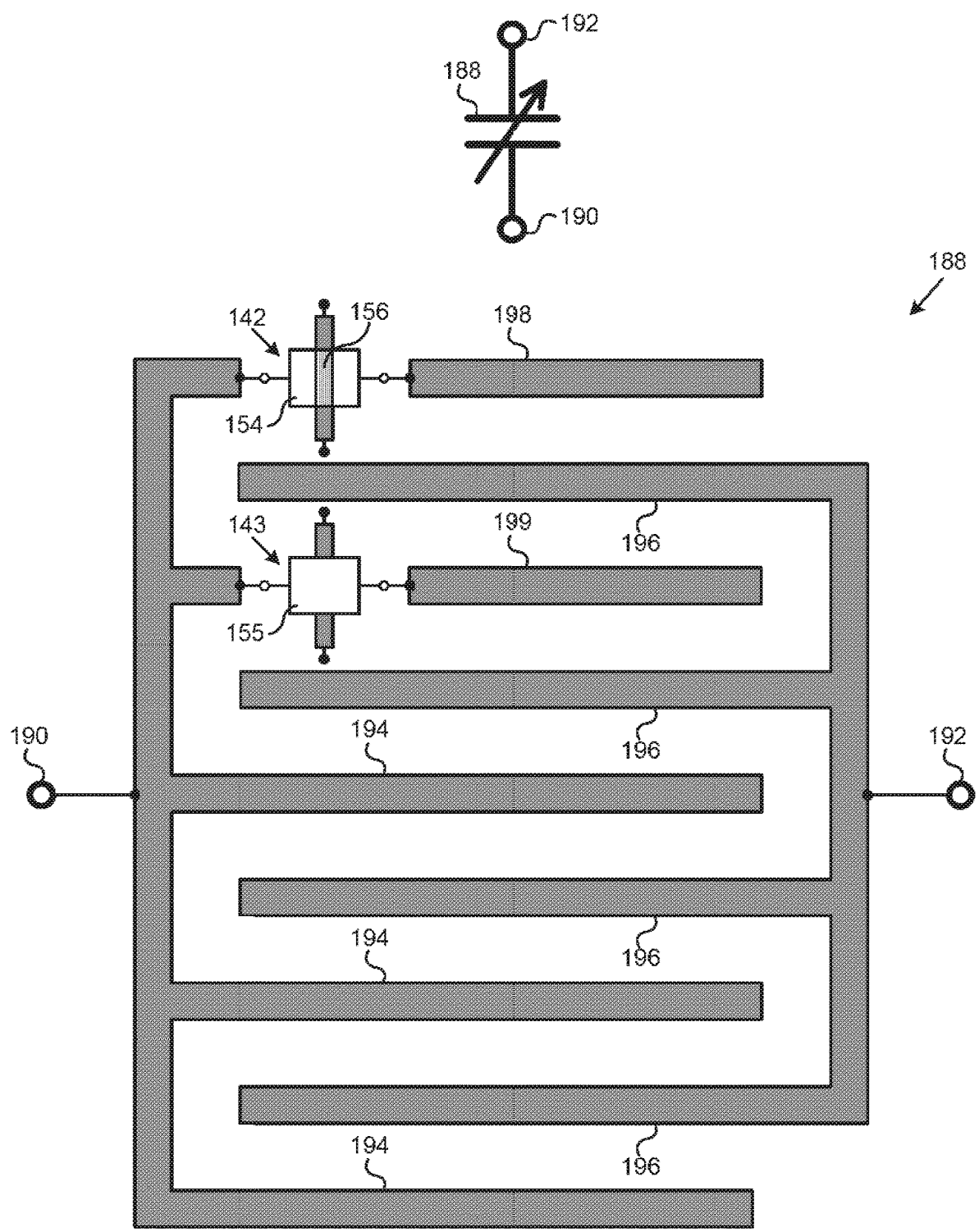
FIG. 9 illustrates a portion of an adjustable capacitor employing PCM RF switches according to one implementation of the present application.

FIG. 9 illustrates a portion of an adjustable capacitor employing PCM RF switches according to one implementation of the present application. Adjustable capacitor 188 in FIG. 9 generally corresponds to adjustable capacitors 188 and/or 189 in FIG. 8. Adjustable capacitor 188 in FIG. 9 uses multiple segments and PCM RF switches to provide another technique to change the factory setting of an adjustable capacitor. Adjustable capacitor 188 in FIG. 9 includes terminals 190 and 192, segments 194 and 196, PCM RF switches 142 and 143, and selectable segments 198 and 199.

In the present implementation, adjustable capacitor 188 is an interdigitated capacitor. Segments 194 and 196 and selectable segments 198 and 199 are digits of the interdigitated capacitor. Segments 194 are connected to terminal 190, while segments 196 are connected to terminal 192. PCM RF switches 142 and 143 couple terminal 190 to selectable segments 198 and 199 respectively.

Selectable segments 198 and 199 can be engaged and disengaged by respective PCM RF switches 142 and 143. When selectable segments 198 and 199 are disengaged, their shapes and capacitance values effectively do not contribute to the overall shape and capacitance value of the interdigitated capacitor. Rather, the shape and capacitance value are governed by segments 194 and 196. When selectable segments 198 and 199 are engaged, their shapes and capacitance values are effectively added, and they increase the overall capacitance value of the interdigitated capacitor. In the present implementation, selectable segment 199 is engaged, as PCM 155 of PCM RF switch 143 is in a crystalline phase, and selectable segment 198 is disengaged as active segment 156 of PCM 154 of PCM RF switch 142 is in an amorphous phase. Engaging both selectable segments 198 and 199 concurrently will increase the overall capacitance value more than engaging one of selectable segments 198 or 199. Adjustable capacitor 188 can be used as adjustable capacitor 188 in non-volatile tunable RF filter 127 in FIG. 8.

In various implementations, adjustable capacitor 188 can include more or fewer segments 194 and 196 and/or more or fewer selectable segments 198 and 199. In various implementations, selectable segments 198 and 199 can have different sizes or shapes than shown in FIG. 9. In various implementations, selectable segments 198 and 199 can be asymmetrical and have different sizes or shapes from each other, such that adjustable capacitor 188 can achieve coarser and finer adjustments. In various implementations, selectable segments 198 and 199 may be engaged by more than one PCM RF switch.

Although the description of the present implementation primarily focuses on adjusting capacitance values by engaging selectable segments 198 and 199, it is noted that segments 194 and 196 and selectable segments 198 and 199 each also have an inductance value and a resistance value, and that the overall inductance value of adjustable capacitor 188 and the overall resistance value of adjustable capacitor 188 may also be affected and/or purposely varied by engaging selectable segments 198 and 199. In one implementation, adjustable inductor 130 (shown in FIG. 8) can be implemented using PCM RF switches and selectable spiral segments (not shown in FIG. 8 or 9). In various implementations, adjustable capacitor 188 may use any non-volatile RF switches known in the art, instead of or in addition to PCM RF switches 142 and 143.

Thus, various implementations of the present application achieve non-volatile tunable RF filtering utilizing the inventive PCM RF switch of the present application and novel combinations to overcome the deficiencies in the art to provide non-volatility and lower insertion loss. From the above description it is manifest that various techniques can be used for implementing die concepts described in die present application without departing from the scope of those concepts. Moreover, while the concepts have been described with specific reference to certain implementations, a person of ordinary skill in die art would recognize that changes can be made in form and detail without departing from the scope of those concepts. As such, the described implementations are to be considered hi all respects as illustrative and not restrictive. It should also be understood that die present application is not limited to the particular implementations described above, but many rearrangements, modifications, and substitutions are possible without departing from the scope of the present disclosure.

The invention claimed is:

1. A method of tuning a radio frequency (RF) module, said RF module including a non-volatile tunable RF filter, said method comprising:

detecting a desired frequency and an undesired frequency being output by an amplifier of said RF module;

factory-setting a state of at least one non-volatile RF switch in said non-volatile tunable RF filter such that said non-volatile tunable RF filter substantially rejects said undesired frequency and substantially passes said desired frequency;

wherein said at least one non-volatile RF switch comprises a phase-change material (PCM) RF switch having a PCM, PCM contacts situated on top of passive segments of said PCM and not situated on sides of said PCM, a heating element transverse to said PCM such that said PCM contacts situated on top of said passive segments of said PCM do not overlie said heating element, and a contact uniformity support layer situated on said PCM.

2. The method of claim 1, wherein said desired frequency is a fundamental frequency in a wireless communication standard and said undesired frequency is a harmonic frequency in said wireless communication standard.

3. The method of claim 1, wherein said at least one non-volatile RF switch is part of an adjustable capacitor.

4. The method of claim 1, wherein said heating element approximately defines an active segment of said PCM.

5. The method of claim 1, wherein said non-volatile tunable RF filter further comprises an adjustable inductor comprising at least another non-volatile RF switch.

6. The method of claim 1, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

7. The method of claim 1, wherein said heating element comprises a material selected from the group consisting of tungsten (W), molybdenum (Mo), titanium (Ti), titanium tungsten (TiW), titanium nitride (TiN), tantalum (Ta), tantalum nitride (TaN), nickel chromium (NiCr), and nickel chromium silicon (NiCrSi).

8. The method of claim 1, wherein said PCM RF switch comprises a thermally conductive and electrically insulating material situated over said heating element, and wherein said thermally conductive and electrically insulating material is selected from the group consisting of silicon carbide ($Si_XC_Y$), aluminum nitride ($Al_XN_Y$), aluminum oxide ($Al_XO_Y$), beryllium oxide ($Be_XO_Y$), diamond, and diamond-like carbon.

9. A method of tuning a radio frequency (RF) module, said RF module including a non-volatile tunable RF filter, said method comprising:

setting a state of at least one non-volatile RF switch to an ON state or an OFF state so as to vary an adjustable capacitor in said non-volatile tunable RF filter;

substantially rejecting an undesired frequency and substantially passing a desired frequency based on said state of said at least one non-volatile RF switch;

wherein said at least one non-volatile RF switch comprises a phase-change material (PCM) RF switch having a PCM, PCM contacts situated on top of passive segments of said PCM and not situated on sides of said PCM, a heating element transverse to said PCM such that said PCM contacts situated on top of said passive segments of said PCM do not overlie said heating element, and a contact uniformity support layer situated on said PCM.

10. The method of claim 9, wherein said heating element approximately underlies an active segment of said PCM.

11. The method of claim 9, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

12. The method of claim 9, wherein said heating element comprises a material selected from the group consisting of tungsten (W), molybdenum (Mo), titanium (Ti), titanium tungsten (TiW), titanium nitride (TiN), tantalum (Ta), tantalum nitride (TaN), nickel chromium (NiCr), and nickel chromium silicon (NiCrSi).

13. The method of claim 9, wherein said PCM RF switch comprises a thermally conductive and electrically insulating material situated over said heating element.

14. The method of claim 13, wherein said thermally conductive and electrically insulating material is selected from the group consisting of silicon carbide ($Si_XC_Y$), aluminum nitride ($Al_XN_Y$), aluminum oxide ($Al_XO_Y$), beryllium oxide ($Be_XO_Y$), diamond, and diamond-like carbon.

15. The method of claim 13, wherein said thermally conductive and electrically insulating material is a nugget approximately aligned with said heating element.

16. The method of claim 9, wherein said desired frequency is a fundamental frequency in a wireless communication standard and said undesired frequency is a harmonic frequency in said wireless communication standard.

17. The method of claim 16, wherein said fundamental frequency is between approximately 5.0 GHz and approximately 6.0 GHz, and said harmonic frequency is between approximately 10.0 GHz and approximately 12.0 GHz.

18. The method of claim 9, wherein said adjustable capacitor comprises selectable segments that are engaged or disengaged by a plurality of non-volatile RF switches so as to adjust said adjustable capacitor.

19. The method of claim 9, wherein said non-volatile tunable RF filter further comprises an adjustable inductor comprising at least another non-volatile RF switch.

* * * * *